(12) United States Patent
Chang et al.

(10) Patent No.: US 9,378,946 B2
(45) Date of Patent: Jun. 28, 2016

(54) SILICON SUBSTRATES WITH COMPRESSIVE STRESS AND METHODS FOR PRODUCTION OF THE SAME

(71) Applicant: Global Wafers Co., Ltd, Hsinchu (TW)

(72) Inventors: Yao-Chung Chang, Hsinchu (TW); Chih Chin Liang, Hsinchu (TW); Wen-Ching Hsu, Hsinchu (TW)

(73) Assignee: Global Wafers Co., Ltd, Hsinchu (TW)

( * ) Notice: Subject to any disclaimer, the term of this patent is extended or adjusted under 35 U.S.C. 154(b) by 0 days.

(21) Appl. No.: 14/750,127

(22) Filed: Jun. 25, 2015

(65) Prior Publication Data

US 2015/0380242 A1 Dec. 31, 2015

Related U.S. Application Data

(60) Provisional application No. 62/016,973, filed on Jun. 25, 2014.

(51) Int. Cl.
| | |
|---|---|
| *H01L 29/227* | (2006.01) |
| *H01L 21/04* | (2006.01) |
| *H01L 21/425* | (2006.01) |
| *H01L 21/265* | (2006.01) |
| *H01L 21/02* | (2006.01) |
| *H01L 29/20* | (2006.01) |
| *H01L 29/207* | (2006.01) |
| *H01L 21/78* | (2006.01) |
| *H01L 21/304* | (2006.01) |
| *H01L 21/31* | (2006.01) |
| *H01L 21/324* | (2006.01) |
| *H01L 21/225* | (2006.01) |

(52) U.S. Cl.
CPC ...... *H01L 21/02381* (2013.01); *H01L 21/0242* (2013.01); *H01L 21/0243* (2013.01); *H01L 21/0254* (2013.01); *H01L 21/02433* (2013.01); *H01L 21/02458* (2013.01); *H01L 21/02658* (2013.01); *H01L 21/2258* (2013.01); *H01L 21/304* (2013.01); *H01L 21/31* (2013.01); *H01L 21/324* (2013.01); *H01L 21/78* (2013.01); *H01L 29/2003* (2013.01); *H01L 29/207* (2013.01)

(58) Field of Classification Search
CPC ............ H01L 21/26513; H01L 21/324; H01L 21/265; H01L 21/3245; H01L 21/26456; H01L 21/26506
USPC .......... 438/510, 514, 522, 527, 530; 257/607, 257/610–612
See application file for complete search history.

(56) References Cited

U.S. PATENT DOCUMENTS

| | | | | |
|---|---|---|---|---|
| 4,645,564 | A * | 2/1987 | Morie | ............... H01L 27/10829 148/DIG. 50 |
| 4,791,469 | A * | 12/1988 | Ohmi | .................. H01L 31/1105 257/462 |
| 6,579,772 | B2 * | 6/2003 | Andoh | .............. H01L 29/66136 257/551 |
| 2011/0140243 | A1 * | 6/2011 | Misumi | ................. H01L 21/263 257/617 |

\* cited by examiner

*Primary Examiner* — Hsien Ming Lee
(74) *Attorney, Agent, or Firm* — Osha Liang LLP

(57) ABSTRACT

A heterostructure including: a substrate having a first primary surface, a second primary surface, and a diffusion layer extending a depth into the substrate from the first primary surface; and an epitaxial layer disposed on the second primary surface of the substrate is disclosed along with methods for production of the same.

19 Claims, 12 Drawing Sheets

SILICON SUBSTRATES WITH COMPRESSIVE STRESS AND METHODS FOR PRODUCTION OF THE SAME

CROSS-REFERENCE TO RELATED APPLICATIONS

This Application claims the benefit, pursuant to 35 U.S.C. §119(e), of U.S. Provisional Application 62/016,973 filed on Jun. 25, 2014. This provisional application is herein incorporated by reference in its entirety.

BACKGROUND

Nitride semiconductors are used in the creation of new solid-state lighting, highly efficient amplifiers for wireless communications, advanced power electronics with unprecedentedly low losses, and a large array of new high performance devices, for example.

Among semiconductor materials, gallium nitride (GaN) has been shown to have good electrical conductivity, thermal conductivity and thermal stability. In addition, due to its wide band-gap, GaN is capable of emitting at the green to violet wavelength and is also suitable as a full-color light-emitting element. However, the typical substrates, such as silicon substrates, used for epitaxial growth of GaN have huge differences in lattice constant and thermal expansion coefficient from GaN, namely 17% and 46%, respectively; leading to large stresses during and after their production. As a result of these excessive tensile stresses, bending/bowing or cracking of the heterostructure may occur during the cooling process after the completion of GaN epitaxial film growth, resulting in reduced component yield. For example, FIG. 1 illustrates a cross-section of a heterostructure 10 resulting from conventional GaN epitaxial growth on a silicon substrate. As shown, due to the differences in lattice constant and thermal expansion coefficient the formed heterostructure may exhibit a bending/bowing with the GaN layer having a concave primary surface 12. Adopting a sapphire (Al2O3) substrate may have the same problem (16% lattice mismatch and 34% differences in thermal expansion coefficient) along with a higher cost. In addition, silicon carbide (SiC) can also be used as the substrate (3.5% lattice mismatch and 25% differences in thermal expansion coefficient). However, the cost of SiC is too high for routine use in commercial purposes.

SUMMARY

In one aspect, embodiments disclosed herein relate to a heterostructure including: a substrate having a first primary surface, a second primary surface, and a diffusion layer extending a depth into the substrate from the first primary surface; and an epitaxial layer disposed on the second primary surface of the substrate.

In another aspect, embodiments disclosed herein relate to a method for fabricating a heterostructure, the method including: providing a substrate having a first primary surface and a second primary surface; heating the substrate at a temperature between about 1200° C. and 1300° C. in the presence of p-type or n-type dopants to form a diffusion layer extending from the first primary surface a depth into the substrate; depositing an epitaxial layer on the second primary surface.

In yet another aspect, embodiments disclosed herein relate to a method for fabricating a heterostructure, the method including: providing a substrate having a first primary surface and a second primary surface; heating the substrate at a temperature between 1200° C. and 1300° C. in the presence of p-type or n-type dopants to form diffusion layers extending from the first and second surfaces a depth into the substrate, wherein the diffusion layers are on either side of a non-diffusion layer of the substrate.

Other aspects and advantages of the disclosure will be apparent from the following description and the appended claims.

DETAILED DESCRIPTION

Figure 1:
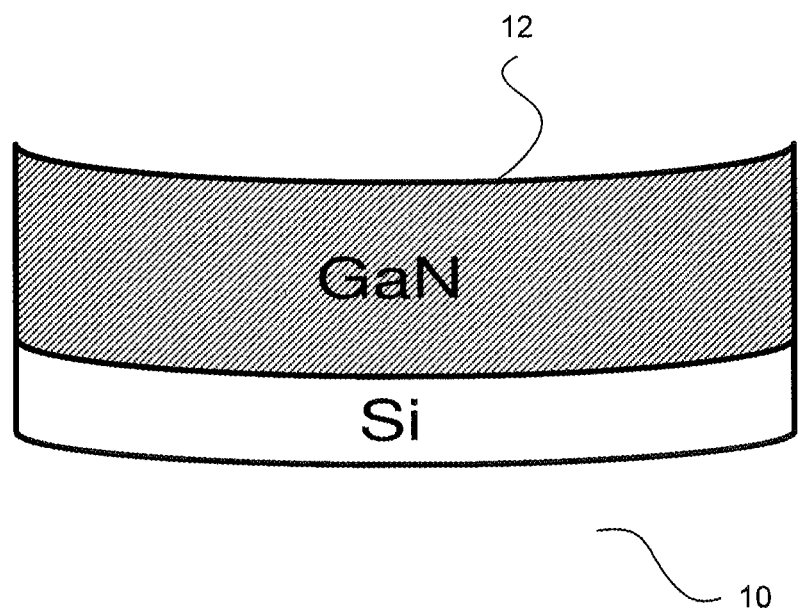
FIG. 1 illustrates a cross-section of a heterostructure resulting from conventional GaN epitaxial growth on a silicon substrate.

One or more embodiments of the present invention generally relates to semiconductor heterostructures having an epitaxial layer of Group III-V compounds, e.g., GaN or AlN, deposited/grown on a substrate and methods for producing the same. Generally, the heterostructures and the methods of this disclosure may use silicon (Si), sapphire (Al2O3), and silicon carbide (SiC) as substrates.

Conventionally, when the epitaxial layer is made of GaN (or other III-V compounds), differences in lattice constant and the thermal expansion coefficient between the substrate and the epitaxial layer are, for different substrates, as follows: for silicon substrates (17%, 46%); for sapphire substrates (16%, 34%), and for SiC substrates (3.5%, 25%). While the SiC substrates have the least lattice constant mismatch and the least thermal expansion coefficients, they are also much more expensive than the other substrates. Due to the differences in lattice constant and thermal expansion coefficients between the substrate and the epitaxial layer, if the epitaxial layer is grown directly on a substrate not modified according to this disclosure, stress fields are generated within the formed heterostructure. Specifically, when the epitaxial layer is grown on a substrate, the substrate becomes stressed by the difference in lattice mismatch and thermal expansion coefficient of the epitaxial layer GaN. Then, when the GaN epitaxial layer is fully grown and cooled in conjunction with the silicon substrate, the GaN epitaxial layer causes greater tensile stress to the silicon substrate than before cooling because of the large thermal expansion coefficient of the GaN epitaxial layer. Consequently, the silicon substrate of the heterostructure may be bent and/or cracked. As discussed above, these stress fields can cause wafer bowing and/or cracking, making processing difficult and possibly impairing device performance.

In some embodiments, by disposing a buffer layer in between the silicon substrate and the epitaxial layer, the heterostructure may be prevented from bending/bowing and/or cracking. Accordingly, in one or more embodiments, a buffer layer having viscoelastic material may be used in conjunction with, i.e., silicon substrates, sapphire substrates, etc. For example, a suitable buffer layer for use with the substrates and III-V compounds of this disclosure may include aluminum nitride (AlN). The buffer layer according to one or more embodiments of the present disclosure may decrease stress caused by lattice mismatch between the silicon substrate and the epitaxial layer. However, even with a buffer layer to reduce the lattice and/or thermal expansion coefficient mismatch the stress fields may be too great to overcome the bowing and/or cracking. Further, the buffer layer must be provided with good lattice structure in order to grow the epitaxial layer with good quality; therefore, it still needs high-temperature crystal growth process, which is complicated and expensive.

In some embodiments, the substrates discussed herein may be doped to be p-type or n-type prior to the application of any methods disclosed herein. Prior to the application of any methods disclosed herein, the geometry of substrates discussed is substantially circular with a diameter of about four inches and a thickness of from about 500 µm to about 1000 µm. The "primary surfaces" of the substrates/heterostructures discussed throughout this disclosure are intended to encompass the diameter or face of the substrates/heterostructures (i.e., the longer dimension surfaces), while the surface encompassing the thickness of the substrates/heterostructures (i.e., the side edge of the circular substrates/heterostructures) may be referred to as "secondary surfaces". In some embodiments, the methods disclosed herein may advantageously produce semiconductor heterostructures with substantially flat primary surfaces at relatively low costs.

As discussed above, due to the lattice constant mismatch and the difference in thermal expansion coefficients, heterostructures of III-V compounds epitaxially applied onto substrates, if left untreated, tend to bend/bow under the stresses induced by the epitaxially applied layer. In other words, the heterostructure's primary surfaces become slightly cupped with the concave surface being the surface possessing the epitaxially applied layer. One or more embodiments of the present disclosure are directed to methods for inducing a bend/bow in a substrate's primary surfaces before the deposition of the epitaxial layer onto the substrate. Thus, when the epitaxial layer is later deposited on the convex primary surface of the pre-bent/bowed substrate, its resultant bend/bow may substantially cancel out the bend/bow previously induced in the substrate so as to ultimately create a substantially flat heterostructure.

One or more embodiments of the present disclosure adopt at least one of the following techniques so as to apply a bend/bow to the substrate and/or reduce the bend/bow in a heterostructure formed therefrom: (1) creating a damage layer on the substrate, (2) application of dopants to form a diffusion layer within the substrate, and (3) applying a protective layer to the substrate. In some embodiments, combinations of all three techniques may be used. In one or more embodiments, the different techniques may be mixed-and-matched depending on the particular circumstances—i.e., using (1) and (3), using (2) and (3), and/or using (1) and (2). The sections below provide more insights pertaining to each of the three separate techniques.

Application of Dopants to Form a Diffusion Layer

In one or more embodiments, the application of dopants to form a diffusion layer within a substrate through a diffusion process may be used as a technique to induce a bend/bow in a substrate prior to the epitaxial deposition of a III-V compound. According to one or more embodiments of the present invention, either an upper primary surface of a substrate may be doped or a lower primary surface of the substrate may be doped, or both primary surfaces of the substrate may be doped to form the diffusion layer extending a depth into the substrate's thickness. In one or more embodiments, the at least one diffusion layer of the substrate may be p++ doped. However, the dopant(s) need not be limited to p-type dopants and may, for example, be n-type dopants to form a n++ doped diffusion layer. As used herein, the plus signs after the "p" or "n" denote the level or concentration of dopants with p++/n++ doped substrates possessing a higher concentration of dopants than p+/n+ doped substrates or p/n doped substrates. Thus, p+/n+ substrates possess a higher concentration of dopants than p/n substrates.

The dopants used, in general, may include but are not limited to: boron, phosphorus, carbon, germanium, nitrogen, arsenic, gallium, and aluminum. Through a diffusion process, which will be explained later, the p++/n++ doping of the substrate forms a diffusion layer of the dopants within the substrate and increases the strength of the substrate due to a solid solution hardening effect. Specifically, when dopants are added to the substrate, the dopants can diffuse into the matrix of the substrate to form an interstitial solid solution where the dopants occupy interstitial spaces within the bulk substrate matrix. In some embodiments, the concentration of the dopants may be highest at the surface and decrease as the depth into the substrate is increased, due to the limiting nature of solid-solid diffusion.

Figure 2:
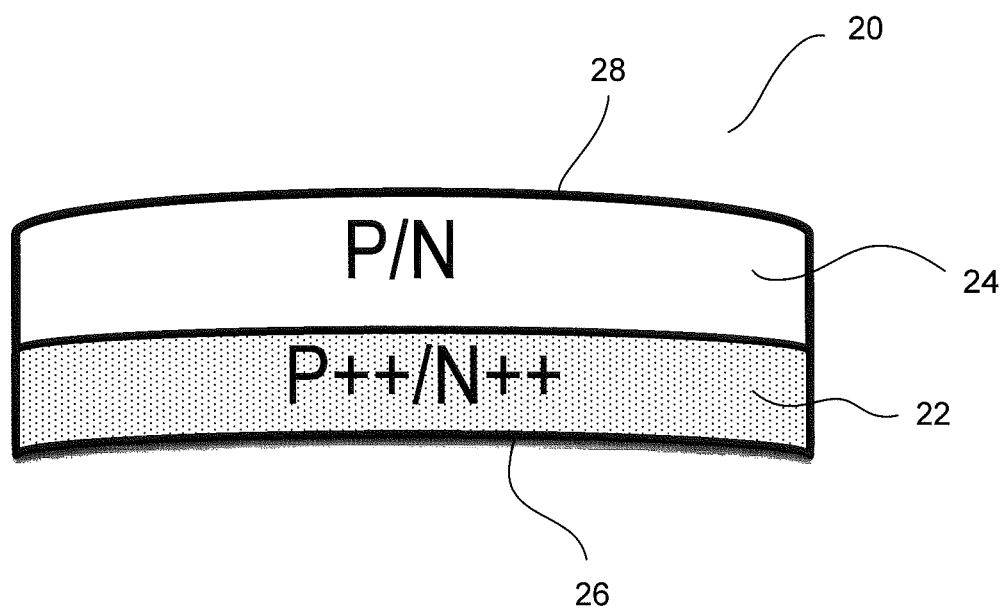
FIG. 2 illustrates a cross-section of a substrate with a diffusion layer according to one or more embodiments of the present disclosure.

Furthermore, when dopants are applied to primary surface(s) of a substrate forming a diffusion layer therein, the substrate tends to bend/bow, with the primary surface(s) that has the diffusion layer forming the concave primary surface with the other primary surface being a convex surface (if selectively applied to only one primary surface of a substrate) due to the limited penetration depth of the dopants. FIG. 2 depicts an embodiment showing what is meant by a "bend/bow" being induced into a substrate by the p++/n++ doping. In FIG. 2 a lower part of a p- or n-type substrate 20 has been p++ doped or n++ doped, respectively, to form a diffusion layer 22 therein. The layer that remains not as heavily doped (i.e., the layer that stays p/n-type due to the limited penetration depth of the dopants) may be referred to as a non-diffusion layer 24. The diffusion layer thereby induces a stress in the substrate that tends to cause the substrate 20 to bend/bow, with the heavily doped diffusion layer 22 encompassing the concave primary surface 26 and the non-diffusion layer 24 encompassing the convex primary surface 28. Without being bound by theory, it is believed that the bend/bow of the substrate may result because the higher dopant concentration results in the formation of a stronger and harder diffusion layer within the substrate, which induces stresses in the substrate that tend to bend/bow the substrate.

In accordance to one or more embodiments of the present disclosure, a substrate having a diffusion layer within either the top or the bottom region of the substrate may have the concave primary surface of the substrate on either the top or bottom, respectively. Thus, in the event that the diffusion layer is within an upper region of the substrate (where the concave primary surface of the substrate upwards), the substrate may be flipped upside down, i.e., 180 degrees, such that the concave primary surface of the substrate is now downwards and so that an epitaxial layer may be applied on its convex primary surface opposite the diffusion layer. Subsequently, when an epitaxial layer is deposited on the convex primary surface of the bending/bowing substrate (i.e., the primary surface opposite the diffusion layer), the heterostructure formed may be substantially flat because of the epitaxial layer's tendency to induce an opposing bend/bow. That is, the flat heterostructure is a product of the opposing induced bends/bows from the bent/bowed substrate having the diffusion layer and the bending/bowing induced by the application/growth of the epitaxial layer. Further, in some embodiments, the convex surface may be etched, polished, or ground by known methods to render the surface flat prior to the deposition/growth of an epitaxial layer thereon.

As discussed above, it is also possible to apply dopants to both a top and bottom surface of a substrate, thereby creating two diffusion layers separated by an undoped or lightly-doped substrate layer (i.e., a non-diffusion layer). In this particular case, the substrate tends to bend/bow so that the concave primary surface is the primary surface where dopants have a higher concentration. For example, if a region around the first primary surface of the substrate has a higher doping concentration in comparison to that of a region around a second primary surface of the substrate, the substrate's first primary surface would be concave. Accordingly, should the concentration of the dopants in a region around the second primary surface be greater than that of a region around the first primary surface, the substrate's second primary surface would be concave. Although, in some embodiments, each primary surface having dopants applied thereto may become a concave primary surface due to the stresses built up upon the application of the dopants. Further, one of ordinary skill in the art would appreciate that if both surfaces of the substrate are to be doped, they may be done so concurrently or separately. For example, one primary surface of substrate may be masked with a material that may prevent dopant incorporation/diffusion, leaving the other surface and region of the substrate to become doped; or if dopants are applied directly to a surface for doping, only one surface may have dopants applied thereto.

In one or more embodiments of the present invention, both primary surfaces of the substrate may be p++ or n++ doped as described above so as to form diffusion layers within both the upper and the lower regions of the substrate. A non-diffusion layer (i.e., an undoped or lighter doped layer) may be sandwiched in between the two diffusion layers due to the limited ability of the dopant to penetrate beyond a certain depth into the substrate. The depth of dopant penetration, may generally (to a point) be increased by an increase in temperature and/or an increase in the time used for dopant application. Further, in some embodiments, one of the primary surfaces including a portion of the diffusion layers may be ground or sheared using sawing, slicing, or other means so as to produce a thinner diffusion layer. It is to be further noted that grinding is to be differentiated from abrasive blasting. As indicated below, while abrasive blasting is also capable of reducing a thickness of the substrate, abrasive blasting adds dense materials to the substrate in the process. Grinding, on the other hand, simply removes a thickness of the substrate. In some embodiments, a buffer layer may be applied to the ground primary surface of the diffusion layer before an epitaxial layer is deposited to further reduce the lattice mismatch between the epitaxial layer and the substrate and further reduce the tensile stress during the epitaxial growth process.

Figure 3:
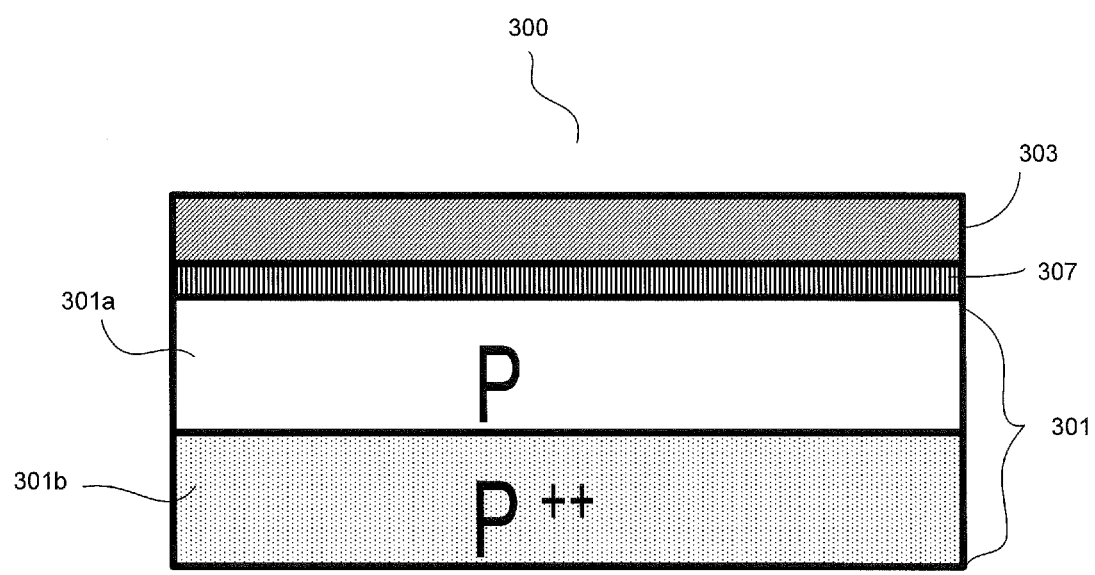
FIG. 3 is a cross-section of a heterostructured semiconductor device according to one or more embodiments of the present disclosure.

FIG. 3 is a semiconductor device heterostructure (300) according to one or more embodiments of the present invention. The semiconductor device heterostructure includes a substrate (301), an epitaxial layer (303), and a buffer layer (307). The substrate 301 has been p++ doped to a certain depth to form a diffusion layer at a bottom region (301*b*), while an upper region of substrate 301 is a non-diffusion layer 301*a* and remains p-type. The epitaxial layer (303) has been applied adjacent to the non-diffusion layer (301*a*) and the buffer layer (307) is arranged in between the non-diffusion layer (301*a*) and the epitaxial layer (303). In some embodiments, the buffer layer 307 may not be present, in which case the epitaxial layer 303 may be deposited/grown directly on the non-diffusion layer 301*a*.

In some embodiments, the epitaxial layer (303) grown on the substrate (301) (or buffer layer 307) is typically made of Group III-V compounds (so named because they are formed from compounds including elements from groups III and V of the Periodic Table of the Elements), which have wide band gaps, high electron mobility, and high physical strength properties, and therefore can be applied to light-emitting elements, high-power components or high-frequency components. For example, the epitaxial layer (303) may be a gallium nitride (GaN) epitaxial layer or an aluminum nitride (AlN) epitaxial layer.

Figure 3A:
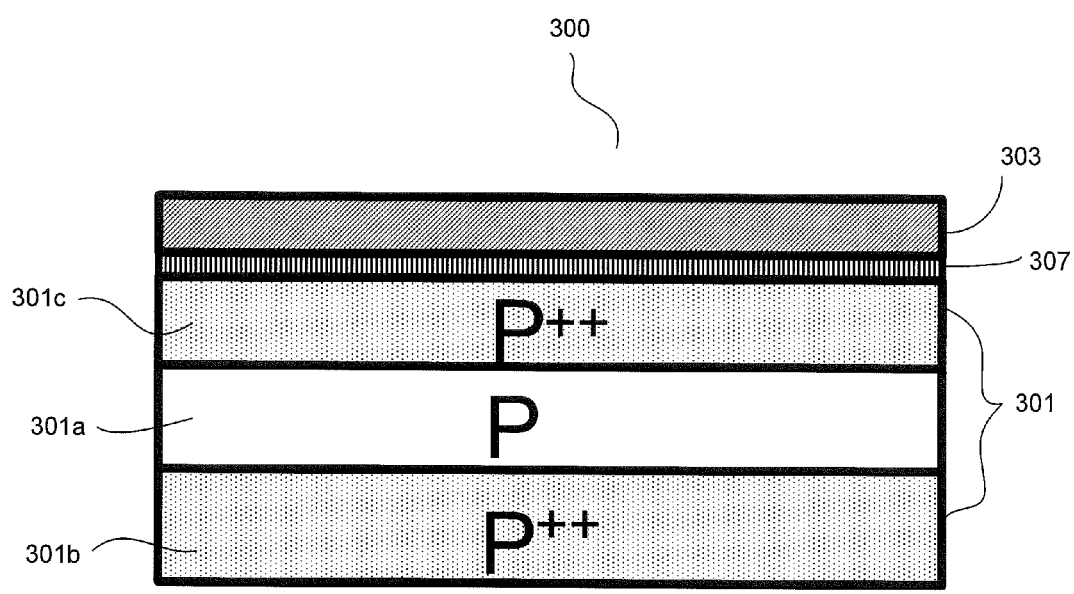
FIG. 3A is a cross-section of a heterostructured semiconductor device according to one or more embodiments of the present disclosure.

FIG. 3A depicts a semiconductor device heterostructure (300) according to one or more embodiments of the present invention. In FIG. 3A, like elements possess matching numbers to those shown in FIG. 3. The semiconductor device heterostructure includes a substrate (301), an epitaxial layer (303), and a buffer layer (307). The substrate 301 has been p++ doped to a certain depth to form diffusion layers at a bottom region (301*b*) and a top region (301*c*), while a middle region of substrate 301 is a non-diffusion layer 301*a* and remains p-type. The epitaxial layer (303) has been applied adjacent to the top region (301*c*) and the buffer layer (307) is arranged in between the top region (301*c*) and the epitaxial layer (303). In some embodiments, the buffer layer 307 may not be present, in which case the epitaxial layer 303 may be deposited/grown directly on the top region 301*c*. In some embodiments, the diffusion layer of the top region 301*c*, adjacent to the epitaxial layer 303, may be thinner than the diffusion layer at the bottom region 301*b*.

Figure 4:
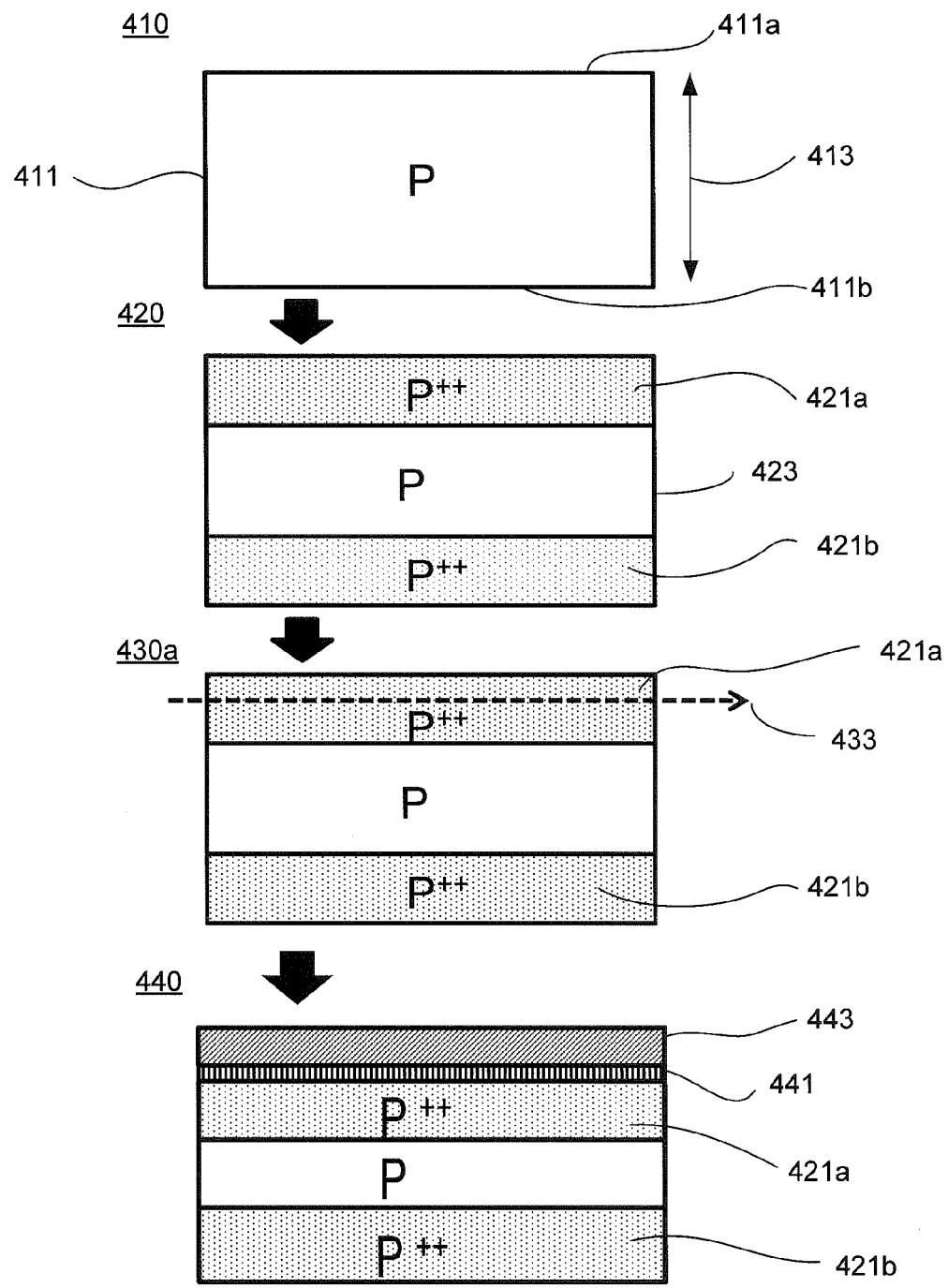
FIG. 4 is a flowchart with cross-sections showing a method of producing a Group III-V compound layer on a Si substrate according to one or more embodiments of the present disclosure.

FIG. 4 is a flowchart showing a method of producing a Group III-V compound layer on a Si substrate involving grinding/slicing a diffusion layer, according to one or more embodiments of the present disclosure. Referring to FIG. 4, the method begins at stage 410, in which a silicon substrate 411 is provided. Although not shown in FIG. 4, the substrate 411 may go through a well-known and conventional "etching" cycle involving a chemical etching or other etching-type process (i.e., polishing), which may be performed to remove residual surface damage, smooth, and clean the primary surfaces (411*a* and 411*b*) of the substrate 411.

In stage 410, a silicon substrate 411 of p- or n-type is typically used. The silicon substrate includes a first primary surface 411a and a second primary surface 411b. In this example, a p-type silicon substrate is used for purposes of illustration only. The silicon substrate 411 has a thickness 413 (i.e., the distance along a secondary surface). In some embodiments, the thickness 413, for example, may be greater than or equal to 500 µm. Further, in some embodiments, the substrate 411 may be about 4 inches in diameter (i.e., the distance along a primary surface).

In one or more embodiments of the present disclosure, the first primary surface 411a and the second primary surface 411b each may be a silicon {1 1 1} surface. The silicon {1 1 1} surface may be obtained by cleaving or cutting the silicon along a {1 1 1} lattice plane, as defined in accordance to a Miller Index. In other embodiments of the present disclosure, the first primary surface 411a and the second primary surface 411b each may be a silicon {1 0 0} surface. The silicon {1 0 0} surface may be obtained by cleaving or cutting the silicon along a {1 0 0} lattice plane, as defined in accordance to a Miller Index.

In specific embodiments, the silicon substrate 411 may be chosen to have the {1 1 1} surface because the configuration has a relatively small mismatch with respect to a particular protective layer, which may be formed on the silicon {1 1 1} surface in some processes. While silicon of different lattice plane defined surfaces may be used, one of ordinary skill in the art would appreciate that certain parameters, i.e., types of dopants used, doping time, etc., may need to be adjusted depending on the nature of the mismatches and the exposed primary surfaces used.

In stage 420, the two primary surfaces 411a, 411b (seen in stage 410) and the surround regions may be p++/n++ doped by a diffusion process. Dopants may include but are not limited to: boron, phosphorus, carbon, germanium, nitrogen, arsenic, gallium, and aluminum. In some embodiments, the diffusion process may last from about 5 hours to about 400 hours. In some embodiments, diffusion processes according to this disclosure may take place at temperatures from about 1200° C. to about 1500° C. In some embodiments, diffusion processes according to this disclosure may enable a p++/n++ doping depth of approximately 20-250 microns into a silicon substrate. However, one of ordinary skill in the art would appreciate that doping depth may vary with respect to time depending on the specific dopant(s) and conditions used.

In one or more embodiments of the present invention, the diffusion/dopant material can be solid (e.g., a diffusion sheet containing dopants, like a borax glass), liquid, and/or gas (e.g., phosphorus oxychloride ($POCl_3$)). The $POCl_3$ is a deep diffusion raw material that is a liquid before entering a tube furnace and a gas after being heated in the tube furnace. In some embodiments $POCl_3$ may be used as a liquid (or gaseous when heated) phosphorous source, wherein the phosphorous acts as a n-type dopant for silicon substrates. In some embodiments, borax glass (also known as, sodium borate, sodium tetraborate, and disodium tetraborate) may be used as a solid diffusion/dopant material. For example, the borax glass material may be applied to a primary surface of the substrate and then heated at the above condition to diffuse boron into the substrate as a p-type dopant.

In one or more embodiments, diffusion may be carried out by heating a substrate in the presence of the desired dopant. That is, dopant can be diffused to the designated depth by controlling the surface concentration of the dopant at the substrate surface, the heating temperature, and the diffusion time. In one or more embodiments, the substrate may be put into a furnace at about 200° C. to 800° C., while a temperature for a pre-deposition may be about 1100° C.-1200° C., and the temperature for the diffusion of the dopants into the substrate may be about 1200° C.-1500° C., or more particularly from about 1200° C.-1300° C.

At the conclusion of the doping/diffusion process, a first diffusion layer 421a of may be formed beginning from the first surface 411a and extending into the substrate 411 a depth and a second diffusion layer 421b may be formed beginning from the second surface 411b and extending into the substrate a depth. As the penetration depth of the dopants is limited, a non-diffusion layer 423 containing substantially no additional dopants (i.e. the initial substrate material only) may be sandwiched between the first diffusion layer 421a and the second diffusion layer 421b.

In stage 430a, the first diffusion layer 421a may undergo grinding/slicing so as to create a thinner and flatter (if the diffusion process caused the surface to become concave) first diffusion layer 421a. The dashed arrow 433 depicts the extent of the grinding. Thus, after the grinding of stage 430, the first diffusion layer 431a may be less thick than the second diffusion layer 421b. In some embodiments, the griding/slicing may remove from about 5 to about 40 microns or from about 15-30 microns from a primary surface.

In stage 440, a buffer layer 441 may be deposited on the surface of the first diffusion layer 421a (as seen in stage 430b, which, in this case, is the previously ground layer. The buffer layer 441 may, for example, be AN or other materials that are structurally similar (i.e., similar lattice constants, composition, etc.) to both the silicon substrate and the III-V compound which will be epitaxially applied/grown. Subsequently, an epitaxial layer 443 comprising a III-V compound may be grown on the buffer layer 441. In other embodiments, the buffer layer may be omitted and the epitaxial layer may be applied directly to the surface of the first diffusion layer 421a. In some embodiments, the resulting semiconductor heterostructure may be substantially flat and have reduced likelihood crack.

In one or more embodiments, depositing the buffer layer and/or depositing the epitaxial layer are completed by a method selected from a group including chemical vapor deposition, electrochemical deposition, gas-liquid solid deposition, vapor transport deposition, sol-gel method, atomic layer deposition, plasma enhanced atomic layer deposition, and combinations thereof, as is known by a skilled artisan.

In accordance to one or more embodiments of the invention, a substrate having a diffusion layer on both the top and the bottom may also be sliced along a central plane between the diffusion layers, i.e., the central plane located along the non-diffusion layer between the two diffusion layers. In this embodiment, two halves of the substrate are formed from the slicing, each having a primary surface including a diffusion layer and a primary surface including a non-diffusion layer. Due to the diffusion layers on each primary surface of the substrate, upon the slicing, two substrates may be foliated with each having a concave surface including its diffusion layer. The upper-half may be flipped, i.e., turned 180 degrees, so as to look substantially the same as the lower-half Subsequently, when the epitaxial layer is deposited on the undoped sliced surfaces (opposite the diffusion layer surface) of the two downward bending/bowing halves, the two resulting heterostructures may be substantially flat because of the epitaxial layer's tendency to bend/bow upwards. That is, a substantially flat heterostructure may be a product of the diffusion layer induced bending/bowing in the substrate counteracting the induced bending/bowing from the applied epitaxial layer. In some embodiments, a buffer layer may be arranged on top (i.e., on the non-diffusion surface) of the two downward bending/bowing halves before the epitaxial layer is deposited to further reduce the lattice mismatch and the tensile stress during epitaxial growth process.

Figure 5:
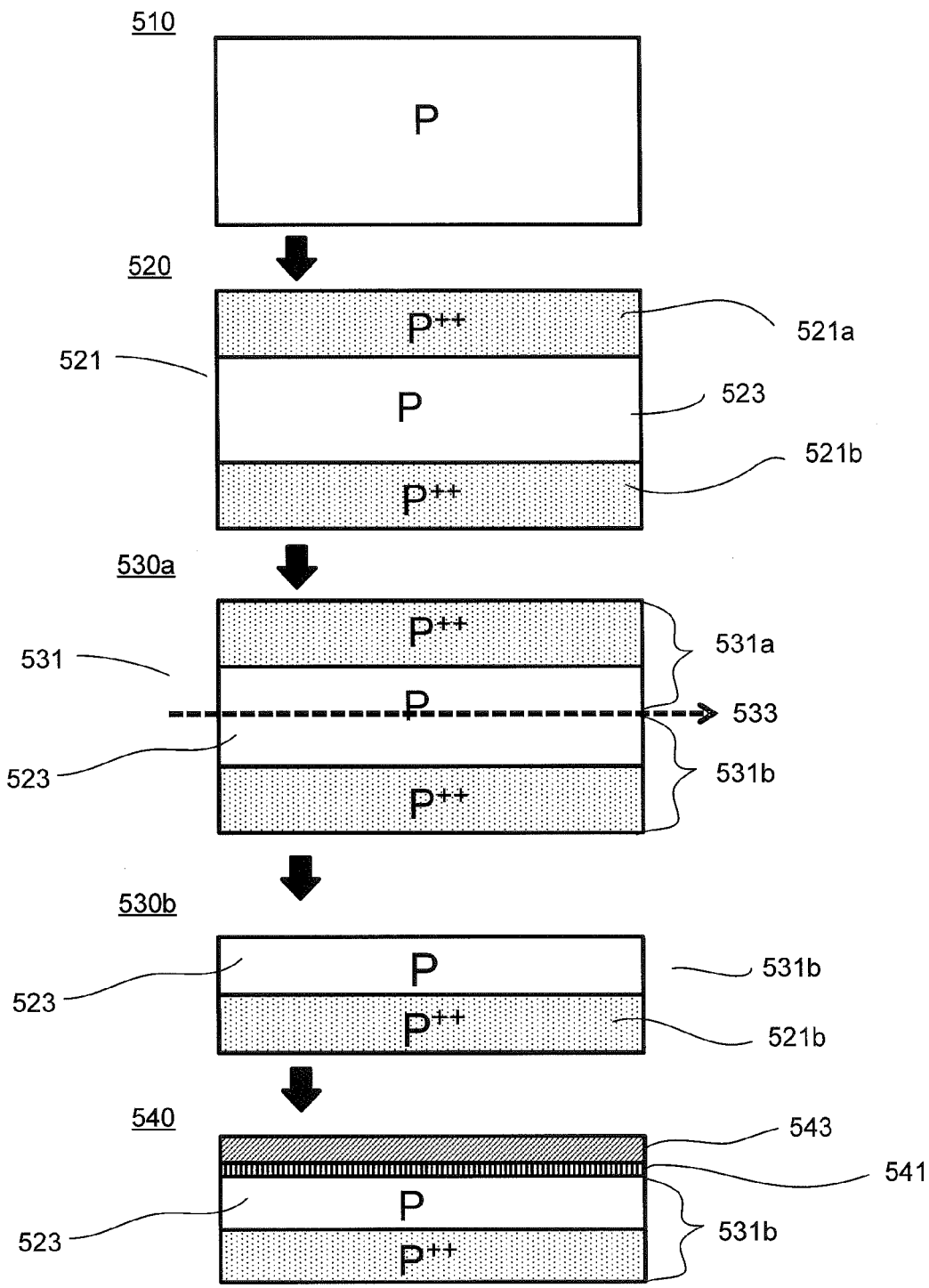
FIG. 5 is a flowchart with cross-sections showing a method of producing a Group III-V compound layer on a Si substrate according to one or more embodiments of the present disclosure.

FIG. 5 is a flowchart 500 showing a method of producing a Group III-V compound layer on a silicon substrate including slicing along a central plane between two diffusion layers, according to one or more embodiments of the present invention. The method depicted is similar to that discussed in reference to FIG. 4 with some modifications. Accordingly, steps and/or details that have already been described may be omitted for brevity. For example, stage 510 and stage 520 correspond to what was shown and discussed in stage 410 and stage 420 of FIG. 4. Thus, stage 520 shows that a substrate 521 with two diffusion layers 521a and 521b and a non-diffusion layer 523 is produced by the p++ doping of a p-type silicon substrate.

Stage 530a differs substantially from stage 430a of FIG. 4. Unlike grinding a portion of a diffusion layer to decrease its thickness (refer to 430a of FIG. 4), in stage 530a the substrate 531 is sliced in two to form two sliced substrates 531a and 531b along dashed arrow line 533 which may be located near a center thickness of the substrate 531 and through a non-diffusion layer 523. In some embodiments, the slicing may be accomplished by using mechanical sawing, laser cutting, or the like. Further, automation techniques may be preferred to ensure accuracy in the slicing (i.e., slicing uniformly along the center thickness of the substrate).

Stage 530b depicts one sliced substrate 531b resulting from the slicing of stage 530a. As can be seen, due to the presence of diffusion layer 521b on only one side of the sliced substrate 531b, the one-half substrate 531b is bent/bowed with a concave primary surface including the diffusion layer 521b. Similarly, sliced substrate 531a would be bent/bowed, with the concave primary surface including the diffusion layer 521a upon the slicing. In this way, two substrates may be created.

In stage 540, a buffer layer 541 may be formed on the non-diffusion layer 523 of the sliced substrate 531b. In some embodiments, the deposition of a buffer layer 541 may be omitted, as discussed above. Further, using epitaxial growth, a GaN layer 543, for example, may be deposited on top of the buffer layer 541. Alternatively, the GaN layer may be deposited directly onto the non-diffusion layer 523 of the sliced substrate 531b. Thus, in stage 540, the bending/bowing initially induced in the one-half substrate 531b is countered by induced bending/bowing from the epitaxial layer to form a substantially flat heterostructure.

Damage Layer

In one or more embodiments, a damage layer may be created by performing abrasive blasting on a primary surface of a substrate. In the abrasive blasting process, an otherwise smooth primary surface of the substrate is roughened by a pressurized blast of dense particles. The dense particulate material used for abrasive blasting may include, but is not limited to, SiC, Al2O3, and/or SiO2. Generally, any material that is denser than the substrate may be used for abrasive blasting. Although a certain thickness of the substrate may be chipped away as a result of the blasting, the blasting may also deposit at least some of the dense particulate materials such as SiC, Al2O3, and/or SiO2 onto the substrate. In one or more embodiments, the abrasive blasting may be performed with a pressure that ranges from 0.1-0.3 Mpa and at room temperature.

Figure 6:
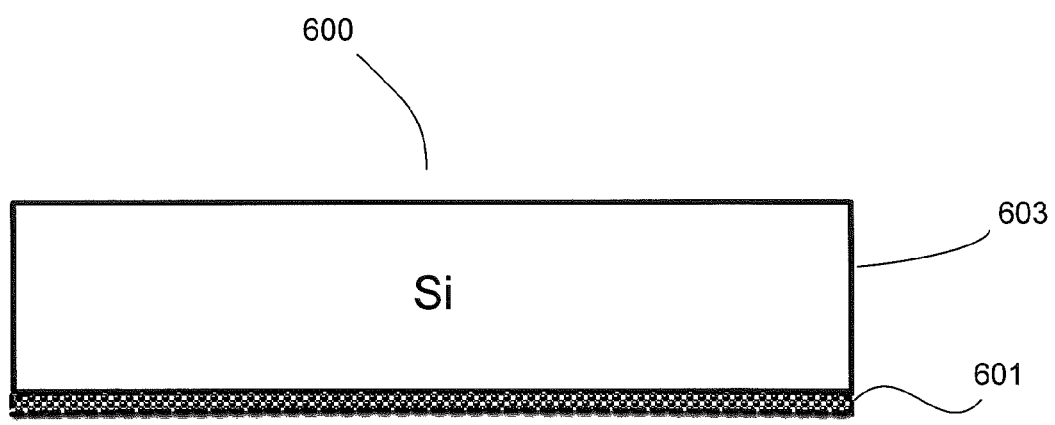
FIG. 6 illustrates a cross-section of a substrate after the application of a damage layer to the substrate according to one or more embodiments of the present disclosure.

FIG. 6 depicts a substrate 600 after the application of a damage layer 601 to the substrate 600 according to one or more embodiments of the present disclosure. As shown, a lower layer of the substrate 600 has the damage layer 601, while an upper layer 603 remains substantially unchanged. The presence of the damage layer 601 induces compressive stress to the substrate 600.

Thus, if an epitaxial layer is later grown/deposited on the substrate primary surface opposite of the damage layer (e.g., the surface of the upper layer 603 in FIG. 6) the heterostructure may become substantially flat because of the deposited epitaxial layer's tendency to induce tensile stress which causes a bow/bend in the opposite direction to the compressive stress induced by the damage layer. Said in other words, the flat heterostructure is a product of the counteracting compressive stress induced by the damage layer and the tensile stress induced by the epitaxial layer. One of ordinary skill in the art would understand what constitutes substantially flat. Specifically, the requirement for flatness may vary from one particular technology to another.

Protective Layer

Finally, a protective layer, which may also be considered a stress adjustment layer, may be formed/applied on a primary surface opposite of the desired epitaxial deposition primary surface of a substrate to reduce bending/bowing and cracking in a heterostructure formed by the epitaxial deposition of a III-V compound layer on the substrate. For example, patent application Ser. No. 14/734,779, filed on Jun. 9, 2015, assigned to the present assignees and incorporated here by reference, discusses the use of a protective layer to reducing stresses that may cause bending/bowing in heterostructures formed by the epitaxial deposition of III-V compounds on a substrate. In one or more embodiments, the protective layer may include at least one glassy, amorphous, and/or viscoelastic materials such as polysilicon, metal silicides, silicon dioxide or silicon nitride. The metal silicides may be transition metal silicides, such as NiSi, Ni2Si, NiSi2, tungsten silicide, titanium silicide, tantalum silicide, molybdenum silicide, and so on. Since polysilicon or metal silicide materials have good thermal mechanical effects better protection to the substrate may be thus obtained.

One property of the viscoelastic material used in the present invention includes decreased stress with time when the stress is fixed, such that the stress field caused by any lattice mismatch may be adjusted. For example, when the GaN grows on silicon substrate, due to the smaller constant of GaN lattice than that of silicon, the silicon substrate would be pressed by stress, GaN would be affected by the tensile stress, and the protective layer set in advance below the substrate can firstly reduce the effects of stress field. Then, when the growth of the GaN epitaxial layer is completed, the GaN epitaxial layer cools down in conjunction with the silicon substrate. Due to the large thermal expansion coefficient, GaN subjects to greater tensile stress (cold shrink) when cooled, and silicon substrate is subject to greater pressure stress to result in bending and crack phenomenon. However, with stress adjustment and protection by the protective layer, stress can be released.

Further, since the viscoelastic material constituting the protective layer has a glassy amorphous structure and is different from a conventional crystalline buffer layer. Therefore, the protective layer may be obtained from a low-temperature process, which is simpler and has less cost without undergoing high temperature treatment for crystal growth. Further, since the protective layer is an amorphous structure, the protective layer would not cause a lattice mismatch issue with the substrate and is applicable to various substrates. Therefore, the choices for the substrate would be wider and so is the application level. In certain embodiments, the protective layer may be applied onto the substrate at a temperature between 900° C. and 1100° C. using thermal oxidation methods or at a temperature between 350° C. and 450° C. using chemical vapor deposition oxidation methods. In more particular embodiments, the protective layer includes amorphous SiO2, which may be applied either using a thermal oxide process or using chemical vapor deposition.

Figure 7:
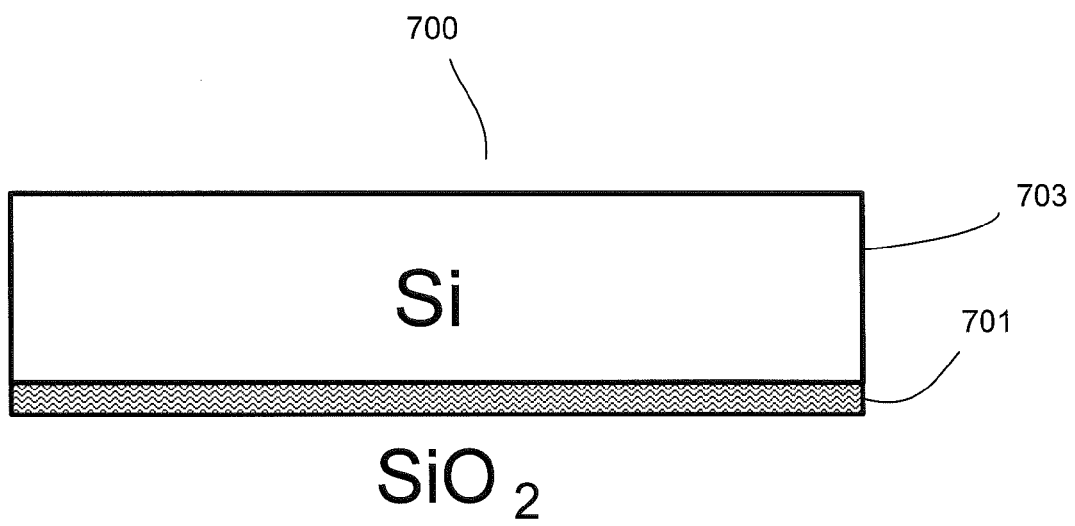
FIG. 7 illustrates a cross-section of a substrate after the application of a protective layer to the substrate according to one or more embodiments of the present disclosure.

FIG. 7 depicts a substrate 700 after the application of a protective layer 701 to the lower primary surface of the substrate 700 according to one or more embodiments of the present disclosure. As shown, a lower layer of the substrate 700 has the protective layer 701, while an upper layer 703 remains the original silicon substrate.

In one or more embodiments of the present disclosure, the epitaxial layer is applied to a particular primary surface of the substrate, and the protective layer is applied to an opposing primary surface of the substrate prior to the application/growth of the epitaxial layer. In one or more embodiments, the thermal expansion coefficients of the epitaxial layer and the protective layer are either both greater or both less than that of the substrate.

Combination of Dopant/Damage/Protective Layer

As mentioned above, in some embodiments combinations of the diffusion layer concept, protective layer concept, and damage layer concept may also be used to produce a substantially flat heterostructure. For example, after blasting to create a damage layer on one or both sides of a substrate, dopants may be added to one or both sides of the substrate. If dopants are added to two damaged primary surfaces of a substrate, the doping/diffusion process results in damage layers with dopants diffused a depth/thickness into the substrate beneath each damaged primary surface. In some embodiments, the substrate can then be sliced, forming two sliced substrates, each having a damage layer on one primary surface with a diffusion layer a depth beneath the damage primary surface along with a sliced primary surface having a non-diffusion layer a depth below. In some embodiments, a protective layer may then be added to the damage layer and a GaN (or other III-V compound) layer may be epitaxially grown on the sliced primary surface to result in a substantially flat heterostructure. In other embodiments, the protective layer may be omitted and a GaN (or other III-V compound) layer may be epitaxially grown on the sliced primary surface to result in a substantially flat heterostructure.

Figure 8:
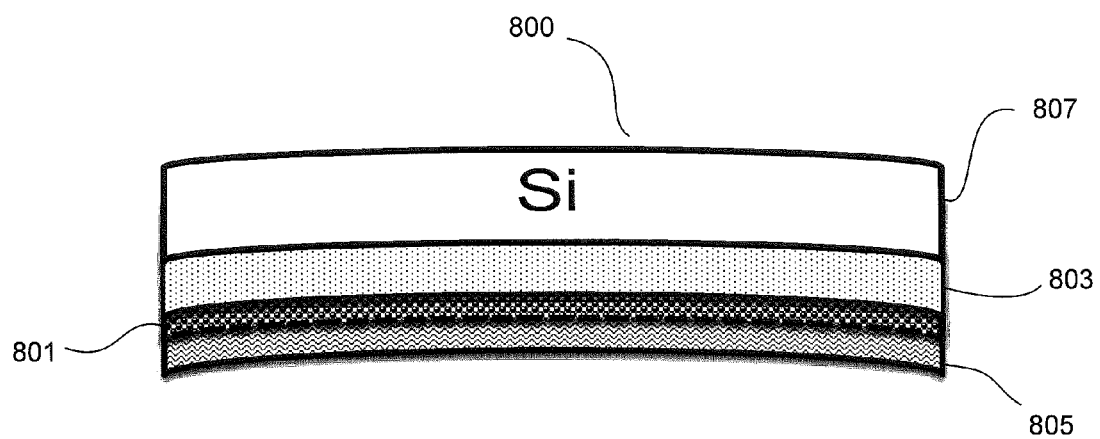
FIG. 8 illustrates a cross-section of a substrate having a damage layer, a diffusion layer, and a protective layer according to one or more embodiments of the present application.

In another embodiment, after blasting a single primary surface of a substrate to form a damage layer, a diffusion layer may then be formed by applying dopants to the damage layer primary surface, resulting in a diffusion layer extending a depth from the damage layer surface into the thickness of the substrate. In some embodiments, following the doping/diffusion process, a protective layer may be applied to the diffusion/damage layer primary surface. This particular embodiment is shown in FIG. 8 where the substrate 800 has a non-diffusion layer 807, a diffusion layer 803, a damage layer 801 and a protective layer 805. A GaN (or other III-V compound) layer may be epitaxially grown on the non-diffusion layers 807 primary surface to result in a substantially flat heterostructure. In other embodiments, the protective layer may be omitted and a GaN (or other III-V compound) layer may be epitaxially grown on the non-diffusion layer 807 primary surface to result in a substantially flat heterostructure.

Further, and as noted above, in some embodiments the following combinations of layers may be applicable in curbing bends/bows and cracks in semiconductor heterostructures having a III-V compound deposited on a substrate: (1) a damage layer and a protective layer; (2) a diffusion layer and a protective layer; (3) a diffusion layer and a damage layer and (4) a damage layer, a diffusion layer, and a protective layer.

In the following detailed description of embodiments, numerous specific details are set forth in order to provide a more thorough understanding of the structure. However, it will be apparent to one of ordinary skill in the art that these embodiments may be practiced without these specific details. In other instances, well-known features have not been described in detail to avoid unnecessarily complicating the description.

EXAMPLES

Example 1

Figure 9:
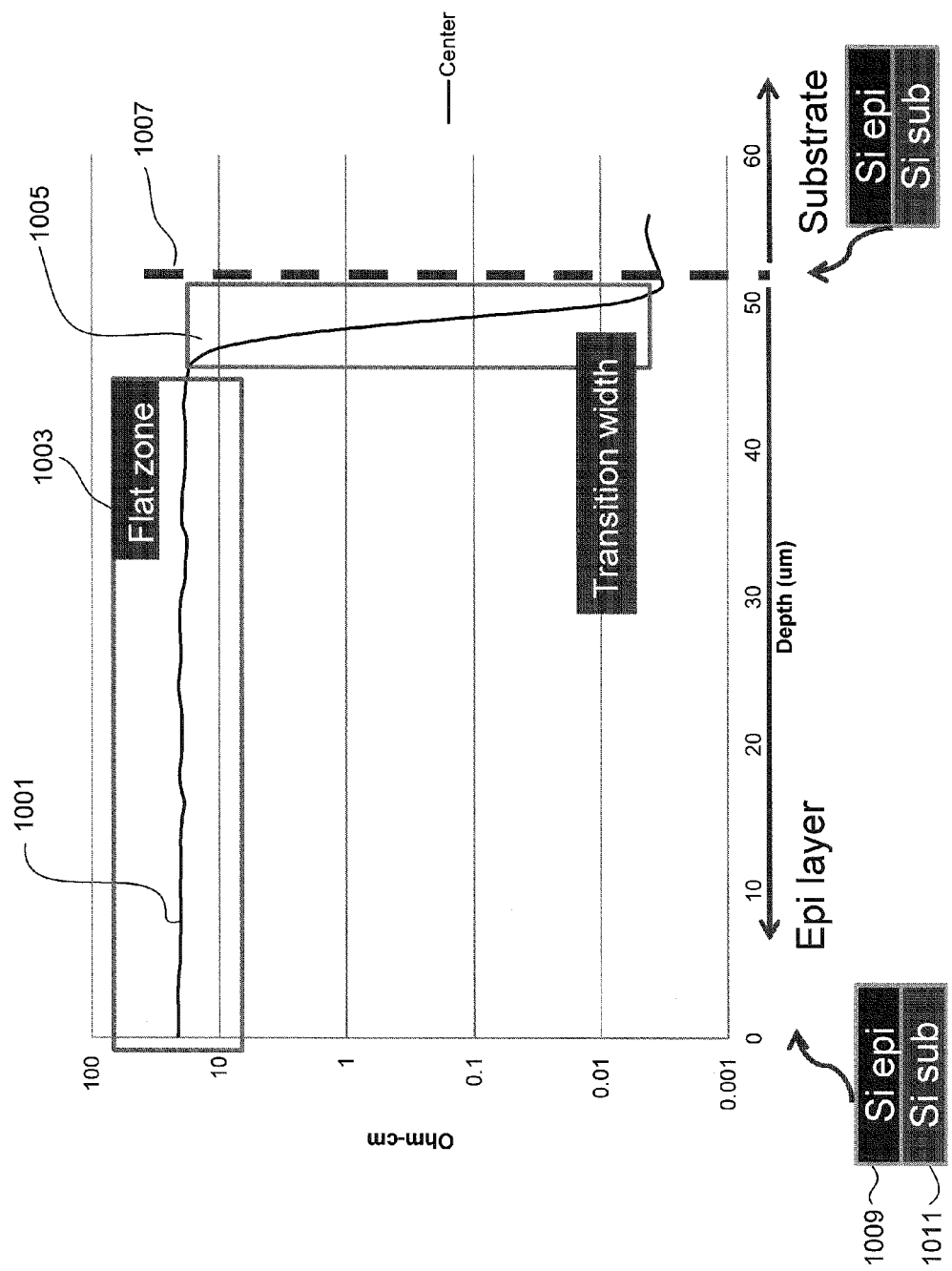
FIG. 9 illustrates experimental data showing resistivity results for a conventional approach to mitigate bending/bowing in substrates prior to the application of a III-V layer to form a heterostructure.

FIG. 9 illustrates experimental data showing resistivity results for a conventional approach to mitigate damage from the bending/bowing in substrates prior to the application of a III-V layer to form a heterostructure. In a conventional approach utilized in industry, silicon is applied epitaxially to a surface of a silicon substrate before a III-V compound epitaxial layer is applied to the substrate. In these instances, the amount of doping in the epitaxially applied silicon is less than the amount of doping in the silicon substrate. After the epitaxial layer of silicon is applied then a III-V compound is applied epitaxially to the surface of the epitaxially applied silicon. FIG. 9 shows resistivity data for a heterostructure comprising a silicon substrate 1011 and a silicon epitaxial layer 1009), the silicon epitaxial layer 1009 being on top of the silicon substrate 1011, as shown in the insets at the bottom of FIG. 9.

Specifically, FIG. 9 presents experimental data showing resistivity values as a function of depth into a substrate of silicon epitaxially applied/grown on a silicon substrate (substrate shown in the lower portion of FIG. 9) so that the change in resistivity when transitioning from the silicon substrate 1011 to the silicon epitaxial layer 1009 can be interrogated. Beginning on the left side of the graph where the resistivity measurements are taken very close to the uppermost primary surface of the silicon epitaxial layer 1009, the resistivities are relatively flat as the measurement probes deeper into the epitaxial layer until the interfacial area of the silicon epitaxial layer 1009 and the silicon substrate 1011. At this interface the resistivity is shown to drastically change within a narrow width (i.e., the slope of the resistivity change is large). One of ordinary skill in the art would appreciate that greater differences in resistivity with respect to a fixed depth in a surface may cause greater stress, and hence increase the possibility for cracks, in a heterostructure of a III-V compound grown on the epitaxially applied/grown silicon/silicon substrate. That is to say, the greater the slope in the experimental data, the more likely that the substrate may crack upon the epitaxial growth of a III-V compound thereon.

Thus in FIG. 9, although the resistivity of the silicon epitaxial layer 1009 remains constant (see flat zone 1003) through most of the silicon epitaxial layer 1009, one can observe a dramatic drop (large negative slope) in resistivity in the transition width 1005 as the probe approaches the interface 1007 with the silicon substrate 1011. Unsurprisingly, this transition width 1005 also happens to be close to the interface 1007 between the silicon substrate 1011 and the silicon epitaxial layer 1009, where there exists a large difference (i.e., dopants and lattice constant between the silicon epitaxial layer 1009 and the substrate 1011.

Example 2

Figure 10:
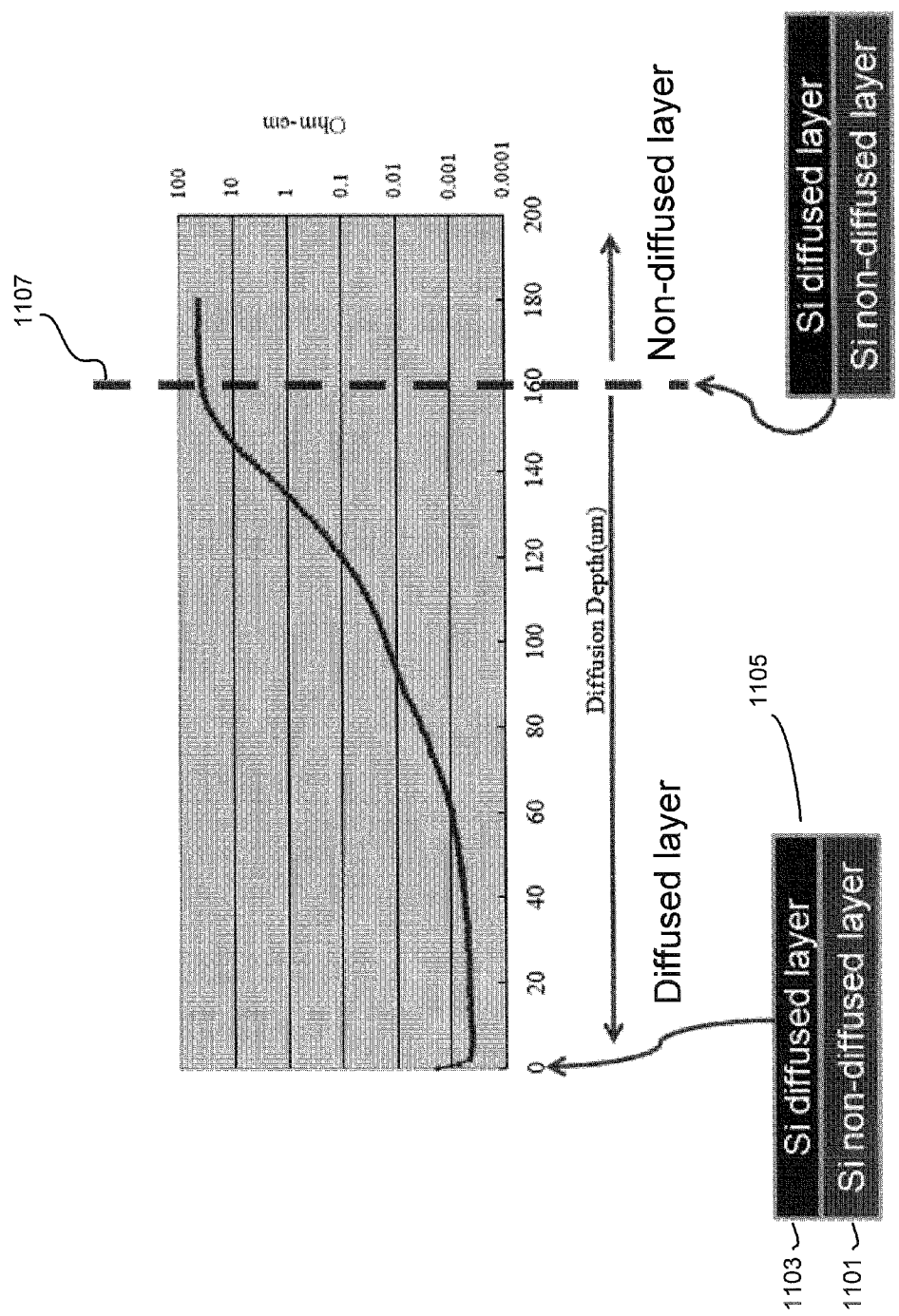
FIG. 10 illustrates experimental data when a diffusion process is applied to a substrate according to one or more embodiments of the present disclosure.

In contrast to FIG. 9 above, FIG. 10 illustrates experimental data when dopant(s) is/are applied to a silicon substrate to form a diffusion layer according to one or more embodiments of the present invention.

FIG. 10 shows a structure comprising a silicon substrate 1105 and a diffusion layer 1103 formed therein, the diffusion layer 1103 being on top of the silicon substrate 1105 in FIG. 10. Additionally, FIG. 10 presents experimental data showing resistivity as a function of depth into the substrate with a diffusion layer. As discussed above, one of ordinary skill in the art would appreciate that greater differences in resistivity with respect to a fixed depth in a surface may indicate greater stress within a substrate, and hence increase the possibility for cracks, in a heterostructure of a III-V compound grown on the substrate. That is to say, the greater the slope in the experimental data, the more likely that the III-V heterostructure formed using said substrate may crack.

In FIG. 10, beginning at the left of the plot where the diffusion layer begins, although resistivity remains flat at first, it increases gradually as the depth into the substrate increases moving towards the region of the silicon substrate 1105 that is not encompassed by the diffusion layer 1103 (i.e., the non-diffusion layer 1101). However, in comparison to the slope of the transition width 1005 in FIG. 9, the slope in FIG. 10, although changing, increases at a much smaller magnitude than that of FIG. 9. Notably, the slope at the interface 1107 between the diffusion layer 1103 and the non-diffused silicon 1101 is much more constant than the slope at the interface 1007 between the silicon substrate 1011 and the epitaxial layer 1009. Accordingly, the experimental data at least reveals that having the diffusion layer 1103 is more helpful in reducing/releasing stresses and thus may prevent cracks from forming in III-V compound heterostructures formed when the III-V compound is grown/applied to a substrate with a diffusion layer 1103 than a substrate that does not have the diffusion layer 1103 shown in FIG. 10.

Figure 11:
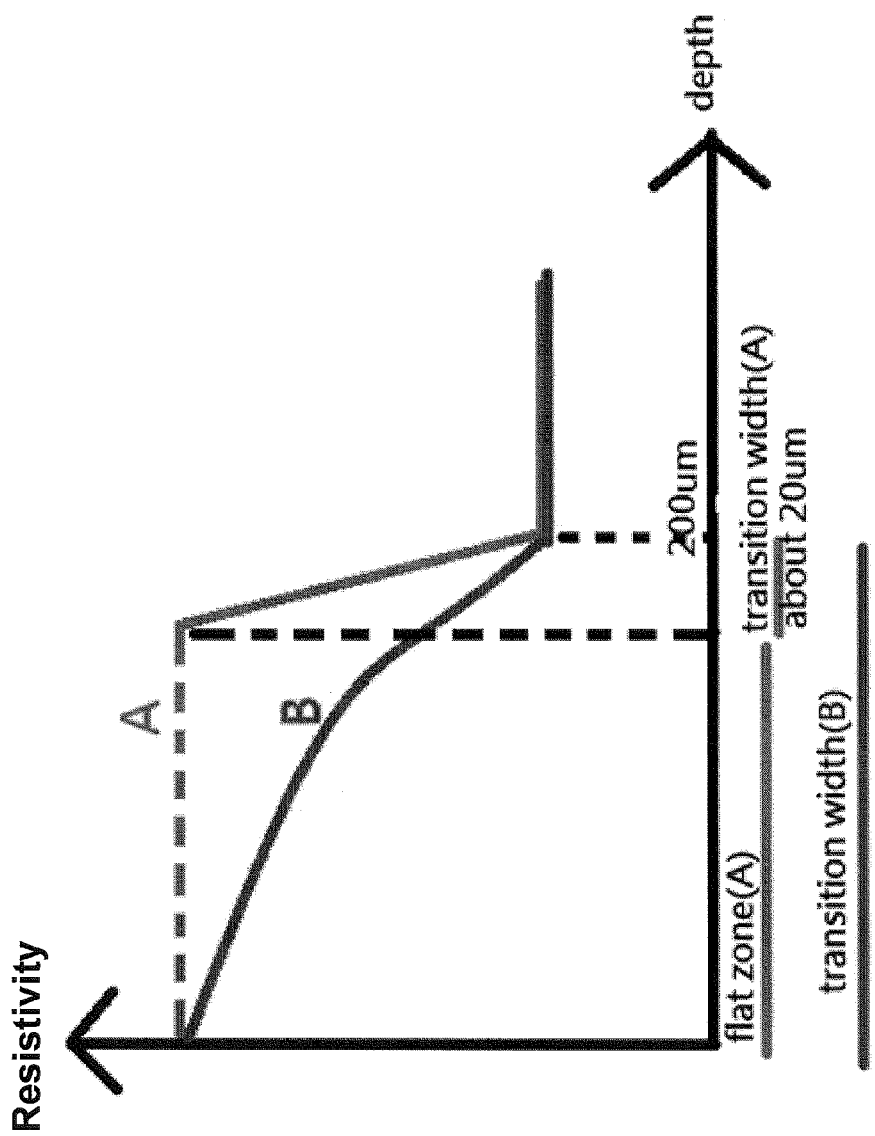
FIG. 11 is a plot comparing the resistivity vs. depth for the two examples depicted in FIG. 10 and FIG. 11.

FIG. 11 depicts a plot showing the comparison in the resistivity versus depth for the conventional approach (i.e., epitaxially applied silicon layer grown on a silicon substrate), labeled A, shown in FIG. 9 and the approach shown in FIG. 10 (the diffusion layer concept of the current disclosure), labeled B. Thus, as discussed above the slope of the transition width is much steeper for A indicating that it will be more difficult to release the stress from the epitaxial deposition of GaN (or other III-V compounds) when compared to a currently disclosed approach shown in B.

One of ordinary skill in the art would appreciate that the manufacturing cost of producing a substrate/structure suitable for the epitaxial growth of III-V compounds increases as the thickness of the substrate/structure being manufactured increases. Further, one would understand that dopant(s) and diffusion processes constitute added variable manufacturing costs that may increase the overall manufacturing cost. However, in a preliminary economic evaluation, the inventors of the present application have found that there are instances in which substrates having a diffusion layer are cheaper to manufacture than substrates utilizing a conventional approach of having an epitaxial silicon layer deposited thereon. Specifically, the inventors have found that they can manufacture substrates having a diffusion layer more cost effectively than they can manufacture substrates having an epitaxial silicon layer deposited thereon when the diffusion layer/silicon epitaxial layer thickness is greater than 20 microns. Furthermore, although the cost for the application/growth of a silicon epitaxial layer on a silicon substrate may be cheaper when the thickness of the layer is under 20 microns, such thickness may not be sufficient to prevent the bending or cracking during the production of the heterostructured semiconductor devices. Additionally, the economic evaluation also reveals that because having a diffusion layer is more helpful in reducing stress and preventing bends or cracks of substrates than not having a diffusion layer, the cost to manufacture heterostructured semiconductor devices can be significantly reduced by forming a diffusion layer within a substrate.

While the disclosure sets forth various embodiments using specific block diagrams, flowcharts, and examples, each block diagram component, flowchart step, operation, and/or component described and/or illustrated herein may be implemented, individually and/or collectively, using a wide range of configurations. The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While the disclosure has been described with respect to a limited number of embodiments, those skilled in the art, having benefit of this disclosure, will appreciate that other embodiments can be devised which do not depart from the scope of the disclosure as disclosed herein.

Furthermore, one of ordinary skill in the art would appreciate that certain "elements," "components," "parts," "units," or any nonce terms, if used to describe the present invention, may be implemented using any known methods. Accordingly, the scope of the disclosure should be limited only by the attached claims.

What is claimed is:

1. A heterostructure comprising:
   a substrate having a first primary surface, a second primary surface, and a diffusion layer extending a depth into the substrate from the first primary surface; and
   an epitaxial layer disposed on the second primary surface of the substrate;
   wherein the diffusion layer is p++ or n++ doped.

2. The heterostructure of claim 1, wherein the substrate has at least one of the following a p-type or n-type doping, a thickness from about 500 µm to 1000 µm, and a damage layer on the first primary surface.

3. The heterostructure of claim 1, wherein the diffusion layer has a thickness between about 20 µm and 250 µm.

4. The heterostructure of claim 1, wherein the dopant present in the diffusion layer is selected from a group consisting of boron, phosphorus, carbon, germanium, nitrogen, arsenic, gallium, and aluminum.

5. The heterostructure of claim 1, further comprising:
   a protective layer adjacent to the first primary surface.

6. The heterostructure of claim 1, further comprising:
   a buffer layer disposed in between the substrate and the epitaxial layer.

7. The heterostructure of claim 1, further comprising:
   a second diffusion layer extending into the substrate from the second primary surface,
   wherein the second diffusion layer is thinner than the first diffusion layer.

8. A method for fabricating a heterostructure, the method comprising:
   providing a substrate having a first primary surface and a second primary surface;
   first heating the substrate at a temperature between about 1200° C. and 1300° C. in the presence of p-type or n-type dopants to form a diffusion layer extending from the first primary surface a depth into the substrate; and
   then depositing an epitaxial layer on the second primary surface.

9. The method of claim 8, wherein the heating is from about 5 to about 400 hours.

10. The method according to claim 8, further comprising:
abrasive blasting the first primary surface with a material selected from a group comprising SiC, $Al_2O_3$, $SiO_2$, or combinations thereof before the heating.

11. The method according to claim 8, further comprising:
depositing a buffer layer on the second primary surface of the substrate before depositing the epitaxial layer.

12. The method according to claim 11, wherein depositing the buffer layer and depositing the epitaxial layer are completed by a method selected from a group including chemical vapor deposition, electrochemical deposition, gas-liquid solid deposition, vapor transport deposition, sol-gel method, atomic layer deposition, plasma enhanced atomic layer deposition, and combinations thereof.

13. The method according to claim 8, further comprising:
depositing a protective layer adjacent to the first primary surface using thermal oxidation or chemical vapor deposition oxidation.

14. The method according to claim 13, wherein the protective layer is formed from a material selected from a group consisting of polysilicon, metal silicides, $SiO_2$, $Si_3N_4$, tungsten silicide, titanium silicide, tantalum silicide, molybdenum silicide, platinum, nickel and combinations thereof.

15. A method for fabricating a heterostructure, the method comprising:
providing a substrate having a first primary surface and a second primary surface;
heating the substrate at a temperature between 1200° C. and 1300° C. in the presence of p-type or n-type dopants to form diffusion layers extending from the first and second primary surfaces a depth into the substrate.

16. The method of claim 15, wherein the heating is from about 5 to about 400 hours.

17. The method according to claim 15, further comprising:
slicing the substrate at a central thickness of a non-diffusion layer therein to form two sliced substrates each having a diffusion layer and a non-diffusion layer; and
depositing an epitaxial layer on at least a portion of the non-diffusion layer of at least one of the sliced substrates.

18. The method according to claim 15, further comprising:
grinding the first primary surface to decrease the thickness of a first diffusion layer extending from the first primary surface; and
depositing an epitaxial layer on at least a portion of the first diffusion layer.

19. The method according to claim 18, further comprising:
depositing a buffer layer on the first primary surface after the grinding but before depositing the epitaxial layer.

\* \* \* \* \*